United States Patent
Haddad et al.

(10) Patent No.: US 8,389,370 B2
(45) Date of Patent: Mar. 5, 2013

(54) RADIATION-TOLERANT INTEGRATED CIRCUIT DEVICE AND METHOD FOR FABRICATING

(75) Inventors: Nadim Haddad, Oakton, VA (US); Frederick Brady, San Antonia, TX (US); Jonathon Maimon, Manassas, VA (US)

(73) Assignee: Schilmass Co. L.L.C., Wilmington, DE (US)

( * ) Notice: Subject to any disclaimer, the term of this patent is extended or adjusted under 35 U.S.C. 154(b) by 1049 days.

(21) Appl. No.: 11/194,295

(22) Filed: Nov. 25, 2002

(65) Prior Publication Data
US 2005/0275069 A1    Dec. 15, 2005

Related U.S. Application Data

(63) Continuation of application No. 09/629,172, filed on Jul. 31, 2000, now abandoned.

(60) Provisional application No. 60/146,895, filed on Aug. 2, 1999.

(51) Int. Cl.
*H01L 21/336* (2006.01)
*H01L 21/76* (2006.01)
*H01L 21/425* (2006.01)

(52) U.S. Cl. ........ 438/296; 438/433; 438/451; 438/528; 257/E21.54; 257/E21.661

(58) Field of Classification Search ................. 438/424, 438/433, 296, 528, 451; 257/E21.54, E21.661
See application file for complete search history.

(56) References Cited

U.S. PATENT DOCUMENTS

| | | | | |
|---|---|---|---|---|
| 4,364,165 A | * | 12/1982 | Dickman et al. | 438/278 |
| 4,711,017 A | | 12/1987 | Lammert | |
| 4,728,619 A | * | 3/1988 | Pfiester et al. | 438/451 |
| 4,835,112 A | * | 5/1989 | Pfiester et al. | 438/305 |
| 5,245,208 A | * | 9/1993 | Eimori | 257/344 |
| 5,296,392 A | | 3/1994 | Grula et al. | |
| 5,316,965 A | * | 5/1994 | Philipossian et al. | 438/424 |
| 5,760,442 A | | 6/1998 | Shigyo et al. | |
| 5,821,629 A | * | 10/1998 | Wen et al. | 257/382 |
| 5,891,776 A | | 4/1999 | Han et al. | |
| 5,891,787 A | * | 4/1999 | Gardner et al. | 438/424 |
| 5,891,792 A | | 4/1999 | Shih et al. | |
| 5,894,145 A | * | 4/1999 | Chen et al. | 257/296 |
| 5,899,732 A | * | 5/1999 | Gardner et al. | 438/473 |
| 5,936,287 A | * | 8/1999 | Gardner et al. | 257/369 |
| 5,976,956 A | * | 11/1999 | Gardner et al. | 438/473 |
| 6,071,763 A | * | 6/2000 | Lee | 438/162 |

(Continued)

FOREIGN PATENT DOCUMENTS
EP    0880174 A1 * 11/1998

*Primary Examiner* — Charles Garber
*Assistant Examiner* — Ron Pompey
(74) *Attorney, Agent, or Firm* — McAndrews, Held & Malloy, Ltd.

(57) ABSTRACT

An enhanced shallow trench isolation method for fabricating radiation tolerant integrated circuit devices is disclosed. A layer of pad oxide is first deposited on a semiconductor substrate. A layer of pad nitride is then deposited on the pad oxide layer. A trench is defined within the semiconductor substrate by selectively etching the pad nitride layer, the pad oxide layer, and the semiconductor substrate. Boron ions are then implanted into both the bottom and along the sidewalls of the trench. Subsequently, a trench plug is formed within the trench by depositing an insulating material into the trench and by removing an excess portion of the insulating material. A p-well is implanted to a depth just below the depth of the bottom of the trench. This helps to keep the threshold voltage of the IC device below the trench at a high level, and thereby keep post-radiation leakage low. Then, an electrically neutral species is implanted into the wafer.

21 Claims, 3 Drawing Sheets

U.S. PATENT DOCUMENTS

| | | | |
|---|---|---|---|
| 6,080,682 A * | 6/2000 | Ibok | 438/770 |
| 6,081,208 A * | 6/2000 | Kikuchi et al. | 341/50 |
| 6,372,590 B1 * | 4/2002 | Nayak et al. | 438/305 |
| 6,380,036 B1 * | 4/2002 | Oda et al. | 438/289 |
| 7,087,474 B2 * | 8/2006 | Mitsuda et al. | 438/197 |
| 2004/0147055 A1 * | 7/2004 | Brosnihan et al. | 438/50 |

* cited by examiner

RADIATION-TOLERANT INTEGRATED CIRCUIT DEVICE AND METHOD FOR FABRICATING

CROSS-REFERENCE TO RELATED APPLICATIONS

The present patent application is a continuation of U.S. patent application Ser. No. 09/629,172, filed on Jul. 31, 2000, now abandoned, which is based upon, and claims priority from, provisional U.S. Patent Application No. 60/146,895, filed Aug. 2, 1999, wherein the contents of each of the above applications is incorporated herein by reference.

BACKGROUND OF THE INVENTION

1. Technical Field

The present invention relates to integrated circuits in general, and in particular to a method for fabricating integrated circuit devices. Still more particularly, the present invention relates to an enhanced shallow trench isolation method for fabricating radiation-tolerant integrated circuit devices.

2. Description of the Prior Art

Within a semiconductor integrated circuit (IC) device, device isolation regions can typically be found between two adjacent active components to prevent carriers from traveling between the two adjacent active components. For example, device isolation regions are conventionally formed between two adjacent field effect transistors (FETs) to reduce charge leakage to and from the two FETs. Often, device isolation regions take the form of thick field oxide regions extending below the surface of a semiconductor substrate. The most common technique for forming a thick field oxide region is to use a local oxidation of silicon (LOCOS) processing technique that is well-known to those skilled in the art of semiconductor processing. Details related to the LOCOS processing techniques can be found in *VLSI technology*, S. M. Sze, McGraw-Hill, 1983, which is incorporated by reference herein.

However, bird's beak regions formed in the LOCOS growth of field oxide regions are undesirable because they are typically too thin to provide any impact in terms of device isolation. Bird's beak regions nevertheless consume substrate surface area, limiting the extent to which the field oxide region can be shrunk while still providing desirable levels of device isolation. To provide higher device densities, it is therefore desirable to utilize a better device isolation structure such as shallow trench isolation (STI). With STI technology, a sharply defined trench is formed in the semiconductor substrate by, for example, anisotropic etching. The trench is filled with oxide back to the surface of a semiconductor substrate to provide a device isolation region. Trench isolation regions formed by STI have the advantages of providing device isolation across their entire lateral extent and of providing a more planar structure.

The present disclosure provides an improved STI method for fabricating a shallow trench that yields a desirable level of radiation tolerance so that the resulting semiconductor IC device can be used in high-radiation environments. Radiation tolerance refers to the ability of a semiconductor IC device to withstand radiation without alteration of its electrical characteristics. A semiconductor IC device is said to be radiation tolerant if it can continue to function within specifications after exposure to a specified amount of radiation.

SUMMARY OF THE INVENTION

In accordance with a preferred embodiment of the present invention, a layer of pad oxide is first deposited on a semiconductor substrate. A layer of pad nitride is then deposited on the pad oxide layer. A trench is defined within the semiconductor substrate by selectively etching the pad nitride layer, the pad oxide layer, and the semiconductor substrate. Boron ions are then implanted into both the bottom and along the sidewalls of the trench. Subsequently, a trench plug is formed within the trench by depositing an insulating material into the trench and by removing an excess portion of the insulating material. Since the boron ions are implanted at an angle during the above-mentioned ion implantation step, the semiconductor IC device advantageously exhibits enhanced radiation-tolerance.

As further steps, a p-well is implanted to a depth just below the depth is of the bottom of the trench. This helps to keep the threshold voltage of the IC device below the trench at a high level; and thereby keep post-radiation leakage low. Then, an electrically neutral species is implanted into the wafer. This implant can be a blanket implant over the whole wafer, or p-channel devices can be shielded from the implant.

Each of these steps can be individually employed to increase radiation hardness over conventional levels. However, the best results are achieved when all of the steps are employed in conjunction with one another.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention provides an enhanced shallow trench isolation (STI) method for fabricating radiation tolerant semiconductor integrated circuit (IC) devices, and a preferred embodiment will be described in detail with reference to the accompanying drawings. The fabrication process begins with the division of a semiconductor substrate into active regions where active electrical components are to be formed, and isolation regions that electrically separate the active regions.

Figure 1:
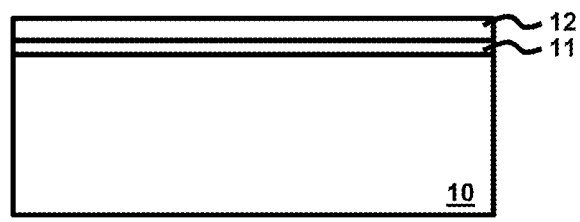
FIG. 1 is a pictorial diagram of a semiconductor substrate having a layer of pad oxide and a layer of pad nitride, in accordance with a preferred embodiment of the present invention.

Referring now to the drawings and in particular to FIG. 1, there is illustrated a pictorial diagram of a semiconductor substrate having a layer of pad oxide and a layer of pad nitride, in accordance with a preferred embodiment of the present invention. As shown, a silicon substrate 10 is coated with a layer of thermal oxide that acts as a pad oxide layer 11. Pad oxide layer 11 protects the surface of substrate 10 from damage in subsequent processing steps. For this purpose, the pad oxide layer has a thickness of approximately 100 Å-300 Å. In addition, a layer of silicon nitride that serves as a pad nitride layer 12 is formed on top of pad oxide layer 11. Pad nitride layer 12 may be deposited by chemical vapor deposition (CVD) to a thickness of 1000-3000 Å.

Figure 2:
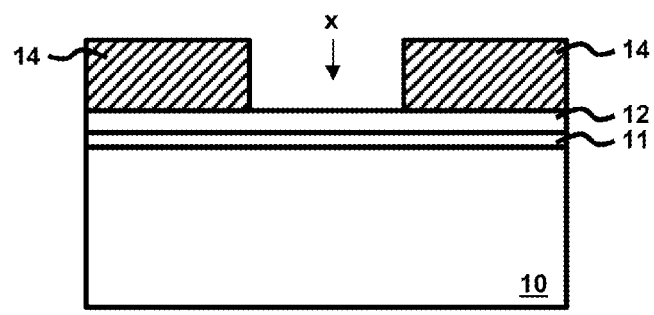
FIG. 2 illustrates the formation of a trench definition mask on the semiconductor substrate from FIG. 1, in accordance with a preferred embodiment of the present invention.

Next, a trench definition mask 14, as depicted in FIG. 2, is formed by exposing and etching a layer of photoresist that was deposited onto pad nitride layer 12. Trench definition mask 14 is shaped in the usual manner so that the surface of pad nitride layer 12 is exposed at a region x where a trench will be formed. Trench definition mask 14 may itself be used as the mask for etching layers 12 and 11 as well as substrate 10 in forming a trench, or trench definition mask 14 may be used to define a mask in pad nitride layer 12 that can then be used for subsequent etching steps. Most often, a photoresist mask is used to define the lateral extent of all of the etching steps used in the formation of a trench in substrate 10 because fewer processing a steps are involved.

Figure 3:
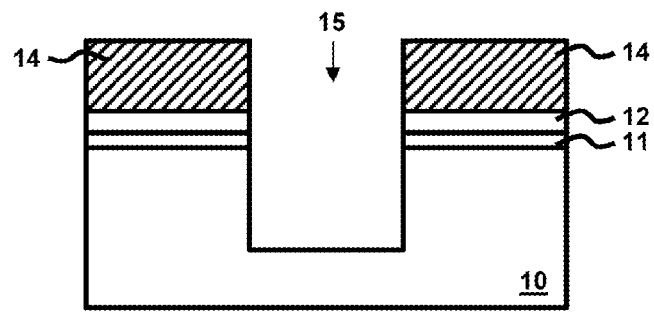
FIG. 3 illustrates the formation of a trench on the semiconductor substrate from FIG. 1, in accordance with a preferred embodiment of the present invention.

A trench 15 is then formed in substrate 10, as illustrated in al FIG. 3, by consecutively etching pad nitride layer 12, pad oxide layer 11, and substrate 10. The etching processes used are preferably anisotropic and may, for example, be performed by reactive ion etching (RIE). For example, a gas etchant, such as $CF_4$ and $O_2$, is used to etch pad nitride layer 12 and pad oxide layer 11. Substrate 10 is etched using RIE and a mixture of gases including $Cl_2$, $O_2$, HBr, and He. The bottom portion of trench 15 can be etched using $SF_6$ so that the transition between the bottom and sidewalls of trench 15 is rounded. An appropriate trench depth for forming a shallow trench isolation is approximately 2000 Å-5000 Å deep. Trench definition mask 14 can be removed at this point. If desired, a thin thermal oxide layer (i.e., sidewall oxide) may be grown on the sidewalls and bottom of trench 15 to remove any defects created by the etching processes. If such a thin thermal oxide layer is formed, the thin thermal oxide layer may either be left in place to become part of a trench plug (such as trench plug 17 shown in FIG. 6) or be removed.

Figure 4:
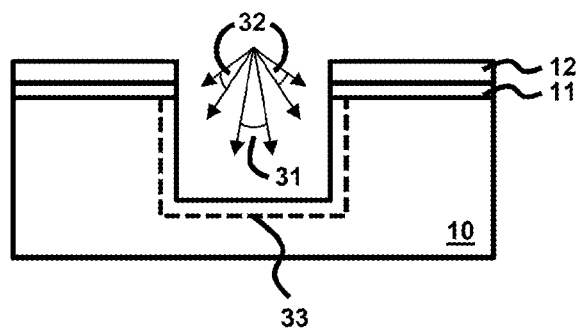
FIG. 4 is a pictorial illustration of the directional boron implantations, in accordance with a first aspect of the present invention.

With reference now to FIG. 4, there is illustrated a pictorial illustration of directional boron ion implantations, in accordance with one aspect of the present invention. As indicated by arrows 31, boron ions are first introduced at an angle in a range of about 0°-7° from a vertical axis. Subsequently, a second implantation 32 at a higher angle, in the range of 30°-45°, is carried out. The boron ion implantation steps preferably have the following parameters: an energy in a relatively low range of about 20 KeV or less, and a concentration of boron ions in a range between approximately $10^{10}$ atoms/$cm^2$ and $10^{13}$ atoms/$cm^2$. If there is a sidewall oxide deposited within trench 15, the energy of the boron ion implantation should be high enough for the boron ions to penetrate through the sidewall oxide and stop in substrate 10. Also shown in FIG. 4 is the area of boron ion implantation within substrate 10, which is marked by a dotted line 33.

The low-angle implant provides a high pre-radiation threshold voltage beneath the trench. Hence, even if a substantial amount of positive charge is trapped in the trench during irradiation, the field threshold remains high, and no radiation-induced leakage occurs between neighboring n-channel transistors. The higher-angle implant provides similar results to create a high is threshold voltage along the side walls of the trench. This helps to keep radiation-induced leakage low along the parasitic sidewall path that typically occurs between the source and drain within an n-channel transistor.

The implantation of the boron ions at an angle into the field isolation area can be carried out in a number of different ways. For example, an ion beam generator can be mounted in a manner such that it can be pivoted relative to the semiconductor substrate, to emit a beam of ions at any desired angle relative to the substrate. More preferably, however, the substrate is mounted on a pivoted or gimbaled platform, so that its orientation relative to a fixed ion beam generator can be varied during the implantation process, to receive the beam of ions at the desired angle. Further, although two separate implantation steps have been described for the bottom and side walls of the trench, a single continuous implantation could be carried out as well. If desired, conventional lithography techniques can be used to protect channel areas from the boron implant.

Figure 5:
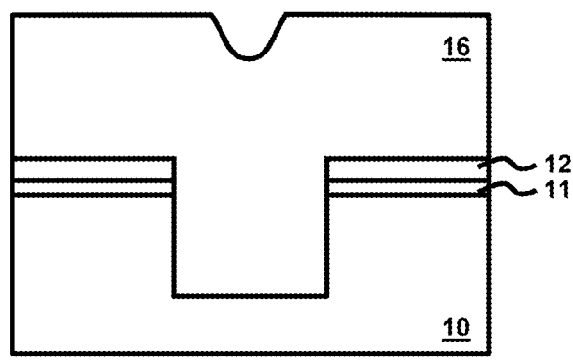
FIGS. 5-8 illustrate the formation of a trench plug on the semiconductor substrate from FIG. 1, in accordance with a preferred embodiment of the present invention.
Figure 6:
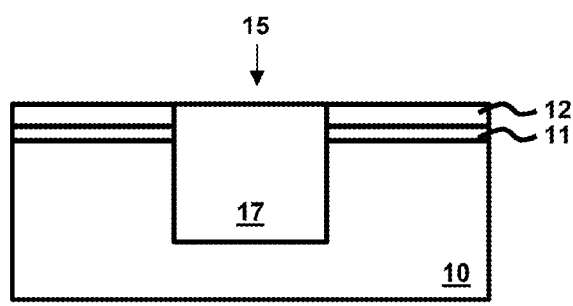

Next, trench 15 is filled with a layer of silicon oxide 16 by, for example, low pressure chemical vapor deposition (LPCVD) using tetraethylortho-siloxane (TEOS) as a source gas. Trench 15 is overfilled during deposition, as shown in FIG. 5, in order to achieve good planarization during subsequent CMP process and to account for possible densification. Densification of the TEOS oxide is preferably accomplished at a temperature of approximately 1000° C. for 10-30 minutes. After densification, the portion of the TEOS oxide layer extending above pad nitride layer 12 is removed by chemical mechanical polishing (CMP) using pad nitride layer 12 as a stop for the polishing process. After the CMP process, some oxide is left inside trench 15 to form a trench plug 17, as depicted in FIG. 6. Although not clearly shown in FIG. 6, the surface of trench plug 17 is recessed slightly below the surface of pad nitride layer 12 after the CMP process because the silicon oxide in trench plug 17 is softer than the silicon nitride in pad nitride layer 12.

Figure 7:
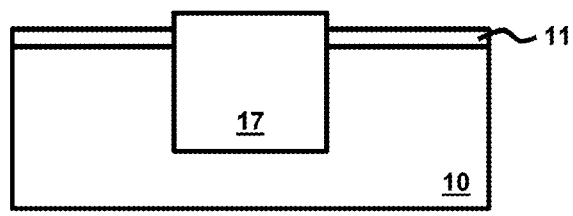
Figure 8:
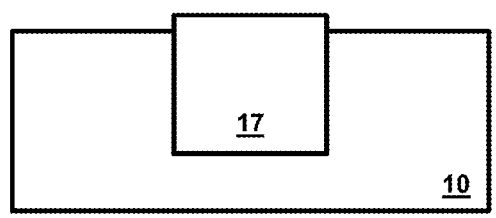

Pad nitride layer 12 is subsequently removed to expose pad oxide layer 11, typically leaving a portion of trench plug 17 extending above the surface of pad oxide layer 11, as illustrated in FIG. 7. A hydrofluoric acid dip is then used to remove pad oxide layer 11, resulting a structure shown in FIG. 8. A greater depth of trench plug 17 than that of pad oxide layer 11 is removed during this etching process because trench plug 17, which is formed of TEOS, is etched more rapidly than pad oxide layer 11, which is formed of thermal oxide.

Figure 9:
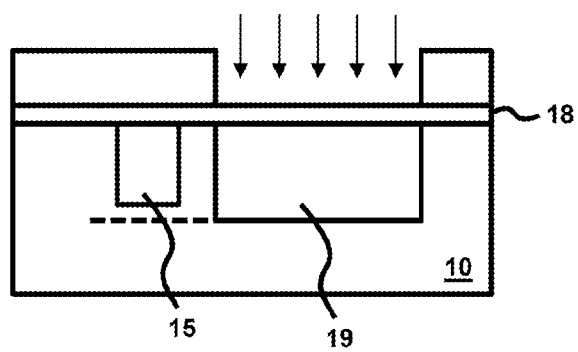
FIG. 9 illustrates the formation of a P-well, in accordance with a second aspect of the invention.

A sacrificial oxide layer 18 is grown on the surface of substrate 10 for protecting the surface of substrate 10 and for limiting the channeling of ions implanted in subsequent ion implantation steps. A p-type dopant, such as boron or indium, is then implanted to form a P-well 19, as depicted in FIG. 9. As a second feature of the invention, the energy of the implant is determined so that the depth of the well 19 is just below the bottom of the trench 15. This arrangement helps to keep the threshold beneath the trench at a high level, so that post-radiation leakage remains low.

In an embodiment of the invention where the P-well is formed by a boron implant, the step of implanting the boron can be carried out in conjunction with, or as part of, the low-angle boron implant 31 that occurs prior to filling the trench. Also, conventional photolithography processes can be used to cover p-channel devices during this implant.

Figure 10:
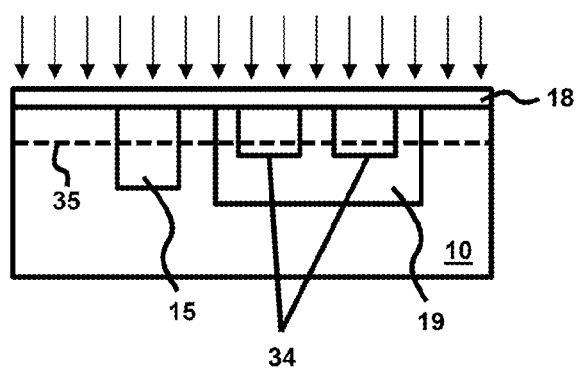
FIG. 10 illustrates the implantation of an electrically neutral material, in accordance with a third aspect of the invention.

As a third step in the radiation hardening of the IC device, an electrically neutral species, such as germanium, is implanted into the wafer. In carrying out this step, a blanket implant can be performed over the entire wafer, as shown in FIG. 10, or photolithography techniques can be employed to shield p-channel devices from the implanted ions. Preferably, high dosage levels are used for this implant, for example around $10^{13}$ atoms/cm$^2$ or higher. The implant energy is adjusted to correspond to the implant depth of the n-channel transistors 34, or both n- and p-channels if a blanket implant is utilized. More specifically, the energy of the implant should be regulated to limit the implantation to a depth 35 which ensures that the electrically neutral species remain in the n$^+$ and p$^+$ diffusion regions. If the implant extends into the junction between these diffusion regions and the well, the diode which results from this junction could be leaky.

Sacrificial oxide layer 18 is subsequently removed, once again using a hydrofluoric acid dip. The semiconductor substrate is thereafter subjected to further processing to complete a fabrication of a semiconductor a IC device. A description of those further processing steps, which are known to those skilled in the relevant art, is not necessary to an understanding of the present invention, and therefore not presented herein.

As has been described, the present invention provides an enhanced STI method for fabricating radiation-tolerant IC devices. The increase in radiation tolerance is attributable to the implantation of boron ions at an angle during an boron ion implantation step. As a result, a higher p-type concentration can be maintained under the field oxide regions of the substrate. Because of the high p-type concentration in the substrate, the substrate is able to withstand a relatively high dose of radiation before any inversion occurs at the surface of the substrate. Further enhancements are provided by implanting the p-well to a depth just below the bottom of the trench, and by implanting an electrically neutral species into the wafer. In view of such, IC devices that are fabricated using the present invention exhibit enhanced radiation-tolerance.

While the invention has been particularly shown and described with reference to a preferred embodiment, it will be understood by those skilled in the art that various changes in form and detail may be made therein without departing from the spirit and scope of the invention.

What is claimed is:

1. A method comprising:
   forming, in a substrate, a trench to provide isolation between two adjacent active regions;
   implanting boron ions into bottom and sidewalls of the trench to provide a high pre-radiation threshold voltage beneath and along the sidewalls of the trench;
   filling the trench with dielectric material;
   forming, in the substrate, a p-well proximate but not beneath the trench;
   forming, in the p-well, an n-channel device in one of the two adjacent active regions such that the n-channel device extends from a surface of the substrate to a first depth; and
   blanket implanting an electrically-neutral material into the surface of the substrate to a depth less than the first depth.

2. The method of claim 1, wherein said implanting boron ions comprises implanting with a dose of boron ions in a range between approximately $10^{10}$ atoms/cm$^2$ and $10^{13}$ atoms/cm$^2$.

3. The method of claim 1, wherein said forming a p-well comprises implanting a p-type material to a depth greater than the bottom of the trench.

4. A method comprising:
   forming, in a substrate, a trench to provide isolation between two adjacent active regions;
   implanting boron ions into bottom and sidewalls of the trench to provide a high pre-radiation threshold voltage beneath and along the sidewalls of the trench;
   filling the trench with dielectric material;
   forming, in the substrate, a p-well proximate but not beneath the trench;
   forming, in the p-well, an n-channel device in one of the two adjacent active regions such that the n-channel device extends from a surface of the substrate to a first depth;
   forming a p-channel device in the substrate;
   forming a mask over the p-channel device; and
   implanting an electrically-neutral material into unmasked portions of the substrate to a depth less than the first depth.

5. The method of claim 4, wherein said implanting boron ions comprises implanting with a dose of boron ions in a range between approximately $10^{13}$ atoms/cm$^2$ and $10^{13}$ atoms/cm$^2$.

6. The method of claim 4, wherein said forming a p-well comprises implanting a p-type material to a depth greater than the bottom of the trench.

7. The method of claim 4, wherein said forming a p-well comprises implanting boron ions to a depth greater than the bottom of the trench.

8. The method of claim 4, wherein said forming a p-well comprises implanting indium ions to a depth greater than the bottom of the trench.

9. The method of claim 4, wherein said implanting boron ions comprises implanting of boron ions with an energy no greater than about 20 KeV.

10. The method of claim 4, wherein said implanting boron ions comprises:
    a first implanting of boron ions at an angle in the range of 0° to 7° from normal; and
    a second implanting of boron ions at an angle in the range of 30° to 45° from normal.

11. The method of claim 4, wherein said implanting an electrically-neutral material comprises implanting germanium into the unmasked portions of the substrate.

12. The method of claim 4, wherein said implanting an electrically-neutral material comprises implanting germanium into the unmasked portions of the substrate with a dosage level of around $10^{13}$ atom/cm$^2$ or higher.

13. The method of claim 1, wherein said implanting boron ions comprises implanting of boron ions with an energy no greater than about 20 KeV.

14. The method of claim 1, wherein said implanting boron ions comprises:
    a first implanting of boron ions at an angle in the range of 0° to 7° from normal; and
    a second implanting of boron ions at an angle in the range of 30° to 45° from normal.

15. The method of claim 1, wherein said implanting an electrically-neutral material comprises implanting germanium into the substrate.

16. The method of claim 1, wherein said implanting an electrically-neutral material comprises implanting germanium into the substrate with a dosage level of around $10^{13}$ atom/cm$^2$ or higher.

17. An apparatus comprising:
    a substrate;
    a trench filled with a dielectric material to provide isolation between two adjacent active regions, wherein a bottom and sidewalls of the trench are implanted with boron ions;
    a p-well formed in the substrate and proximate but not beneath the trench;

an n-channel device formed in the p-well and one of the two adjacent active regions, wherein the n-channel device extends from a surface of the substrate to a first depth; and a radiation hardening layer of electrically-neutral material implanted in the p-well to a depth less than the first depth.

18. The apparatus of claim 17, wherein the p-well is formed to a depth greater than the bottom of the trench.

19. The apparatus of claim 17, wherein the boron ions have a concentration between approximately $10^{13}$ atoms/cm$^2$ and $10^{13}$ atoms/cm$^2$.

20. The apparatus of claim 17, wherein said radiation hardening layer comprises implanted germanium with a dosage level of around $10^{13}$ atom/cm$^2$ or higher.

21. The apparatus of claim 17, further comprising:

a p-channel device formed in the substrate;

wherein the p-channel device extends from a surface of the substrate to a second depth; and wherein the depth of the radiation hardening layer is less than the second depth.

\* \* \* \* \*

UNITED STATES PATENT AND TRADEMARK OFFICE
CERTIFICATE OF CORRECTION

PATENT NO. : 8,389,370 B2  
APPLICATION NO. : 11/194295  
DATED : March 5, 2013  
INVENTOR(S) : Haddad et al.

It is certified that error appears in the above-identified patent and that said Letters Patent is hereby corrected as shown below:

In the Specification

In Column 2, Line 14, delete "depth is of" and insert -- depth of --, therefor.

In Column 2, Line 16, delete "level;" and insert -- level, --, therefor.

In Column 3, Line 24, delete "processing a steps" and insert -- processing steps --, therefor.

In Column 3, Line 26, delete "al FIG. 3," and insert -- FIG. 3, --, therefor.

In Column 3, Line 66, delete "high is threshold" and insert -- high threshold --, therefor.

In Column 4, Line 17, delete "channel" and insert -- p-channel --, therefor.

In Column 5, Line 14, delete "semiconductor a IC" and insert -- semiconductor IC --, therefor.

In the Claims

In Column 6, Line 15, in Claim 5, delete "$10^{13}$ atoms/cm$^2$ and" and insert -- $10^{10}$ atoms/cm$^2$ and --, therefor.

In Column 7, Line 10, in Claim 19, delete "$10^{13}$ atoms/cm$^2$ and" and insert -- $10^{10}$ atoms/cm$^2$ and --, therefor.

Signed and Sealed this  
Eleventh Day of March, 2014

Michelle K. Lee  
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,389,370 B2 | Page 1 of 1 |
| APPLICATION NO. | : 11/194295 | |
| DATED | : March 5, 2013 | |
| INVENTOR(S) | : Haddad et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1484 days.

Signed and Sealed this
Sixteenth Day of December, 2014

Michelle K. Lee
*Deputy Director of the United States Patent and Trademark Office*